United States Patent
Brand et al.

(10) Patent No.: US 6,304,700 B1
(45) Date of Patent: Oct. 16, 2001

(54) DEVICE FOR TRANSMITTING HIGH-FREQUENCY COMMUNICATION SIGNALS AND METHOD FOR MANUFACTURING THE DEVICE

(75) Inventors: Uwe Brand, München; Maximilian Tschernitz, Freising; Karl-August Steinhauser, München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/424,412

(22) PCT Filed: May 6, 1998

(86) PCT No.: PCT/DE98/01262

§ 371 Date: Nov. 22, 1999

§ 102(e) Date: Nov. 22, 1999

(87) PCT Pub. No.: WO98/53520

PCT Pub. Date: Nov. 26, 1998

(30) Foreign Application Priority Data

May 20, 1997 (DE) .............................. 197 21 087

(51) Int. Cl.$^7$ ..................................... G02B 6/44
(52) U.S. Cl. ............................ 385/101; 385/147
(58) Field of Search ......................... 385/100–109, 385/147

(56) References Cited

U.S. PATENT DOCUMENTS

| 4,911,543 | * | 3/1990 | Hodgson | 356/393 |
| 5,021,928 | * | 6/1991 | Daniel | 385/147 |
| 5,183,323 | * | 2/1993 | Daniel | 385/147 |
| 5,418,504 | | 5/1995 | Nottenburg . | |
| 5,736,686 | * | 4/1998 | Perret, Jr. et al. | 178/18 |

FOREIGN PATENT DOCUMENTS 0 309 982   4/1989  (EP) .

OTHER PUBLICATIONS

F. E. Gardiol, "Design and layout of microstrip structures", IEEE Proceedings Microwaves, Antennas & Propogation, vol. 135, Pt. H, No. 3, Jun. 1998, pp. 145–157.

E. Pillai, et al., "The effects of inhomogeneous substrates on high speed digital transmission", Konferenz–Einzelbericht: MIOP '93, Microwellen und Optronik, 7, Kongressmesse f. Hoechstfrequenztechnik, Sindelfingen, D. 25–27, May 1993, vol. 10, pp. 383–387.

\* cited by examiner

Primary Examiner—Akm E. Ullah
(74) Attorney, Agent, or Firm—Schiff Hardin & Waite

(57) ABSTRACT

A device for transmitting high-frequency signals over data lines which are fixed on conventional circuit boards at a specific angle to optical fiber bundles forming the circuit boards.

6 Claims, 2 Drawing Sheets

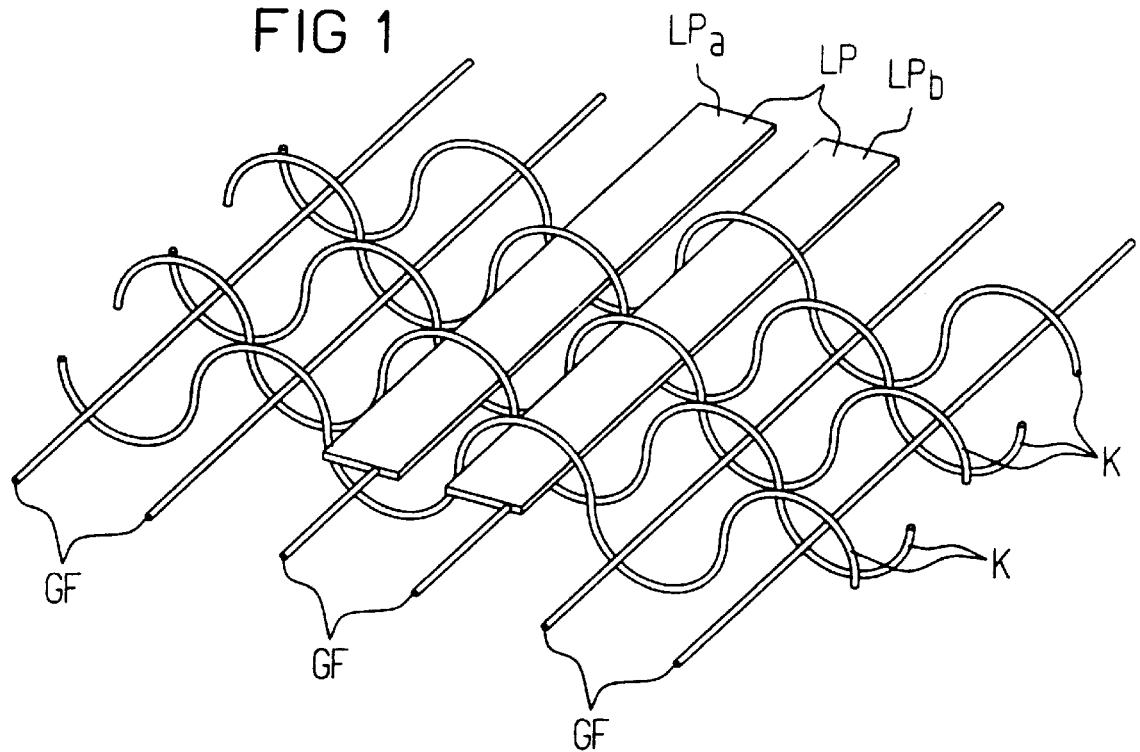
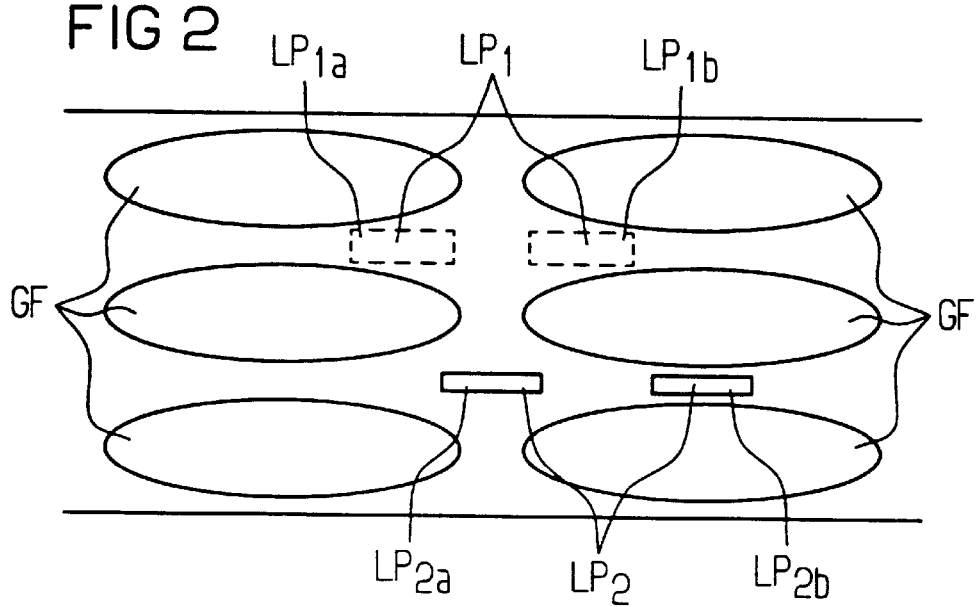

DEVICE FOR TRANSMITTING HIGH-FREQUENCY COMMUNICATION SIGNALS AND METHOD FOR MANUFACTURING THE DEVICE

BACKGROUND OF THE INVENTION

The present invention relates to a device for transmitting high-frequency signals and to a method for the manufacture thereof.

In communication systems it is increasingly required to transmit and process electrical signals at a very high rate. The electrical signals are formed here as control signals and/or communication signals, in particular. Particularly in communication signals which are transmitted in asynchronous transfer mode (ATM), transmission rates of up to 830 MBit/s can arise. But problems arise in the processing of such high transmission speeds which are unknown in the transmission of data at low speeds.

In general, the transmission of signals entails the problem that electrical signals which are transmitted on lines residing in close proximity to one another, usually on copper cables, couple electromagnetically. At lower frequencies, electromagnetic coupling of the communication signals running on the copper cables does not occur or, is insignificant. However, given ever higher transmission frequencies, such a coupling can no longer be avoided. Couplings result in electromagnetic interference, for example. A suitable shielding could help in this regard, but to take this course of action on every cable in the communication system would be uneconomical.

Therefore, in order to keep potential couplings to a minimum, a complementary transmission of the communication signals via a data line is desired. This line is formed by a cable pair.

This means that one pulse train is transmitted over one of the lines of the cable pair, while the complementary pulse train is transmitted over the other line of the cable pair. Here, a possible crosstalk of signals that are transmitted over neighboring lines causes disturbances on both lines in the same manner. These are then averaged out again at the receive side by forming difference signals. This type of data transmission thus has a relatively high protection against potentially arising interference.

The assemblies or printed circuit boards of longstanding use in communication systems comprise connecting structures in the prior art, where copper tracks run parallel to the edge of the respective printed board (edge-parallel). The relevant electrical signals are then emitted via these copper tracks.

The printed boards used are produced from a material comprising a glass mat. The glass mats themselves consist of individual optical fiber bundles which are soaked in resin and fashioned into a web structure. Copper tracks run at the surface of a glass mat that is formed in this way, via which the electrical signals are conducted in practical operation. The glass mat thus serves as carrier of the copper tracks. In order to obtain a compact construction, a majority of these glass mats with pertaining copper lines are glued together. This means that the majority of these copper tracks runs within the thus formed "layer blocks". The latter then form the actual printed board. Terminals occur at the surface side by means of through-plating.

At very high frequencies, such as are used in the transmission of ATM communication signals, a complementary transmission of the communication signals over a data line is controlled, as already discussed. The density of the copper traces inside the printed circuit board is extremely high. In order to construct the complementary transmission of the communication signals over a data line in a space-efficient manner, a data line is respectively formed from a copper trace pair, as mentioned above. A thoroughly desirable electromagnetic coupling then occurs, since the field lines of the two traces encompass each other.

But a problem arises here that the structure of the interconnects attains the dimension of the web structure. The possibility thus arises that one trace of the pair runs in the vicinity of the optical fiber, while the other trace of the respective pair runs in the resin itself. The two materials have different dielectricity constants, however. Since an edge-parallel leading of the copper traces is provided in this prior art, this means that the copper tracks can run either in the vicinity of an optical fiber or in the resin itself.

But this results in different signal transit times in the transmission process, both in the two copper traces of a pair and between the data lines as well. For a better understanding, the corresponding relations are illustrated in FIG. 3. For example, the differential amplifier, which is arranged at the end of the two copper traces of a pair and which forms the difference signal, receives the edges of the pulses which are transmitting in a complementary fashion at different instants, and on its own part it generates a potentially flat edge or, edge shift therefrom, which can no longer be used to trigger other mechanisms.

One solution to this problem is to use homogenous materials having one dielectricity constant, however, these are expensive.

European Patent Application No. 0 309 982 teaches a substrate material and a method for its production in that the problem of the transit time difference is solved in that the substrate material that is produced with the method consists of several layers and that the fiber bundles of the individual layers are arranged at a specific angle to one another. This produces a quasi-isotropy. In any case, this reference does not contain data lines which conduct electrical signals or the arranging thereof in relation to the fiber bundles. This is unnecessary, since it is not possible for transit time differences between the individual data lines to occur, due to the quasi-isotropy.

SUMMARY OF THE INVENTION

It is an object of the present invention to provide a device to transmit communication signals of extremely high frequency over copper cables in printed boards of a conventional type and to a method for the manufacture thereof.

This object is achieved in accordance with the invention in a device having at least one optical fiber mat formed from a number of optical fiber bundles, and at least one data line for conducting electrical signals formed on a surface of the optical fiber mat at a specific angle to the optical fiber bundles.

The invention is particularly advantageous in that the data lines are no longer led edge-parallel in the pertaining glass mat material, but are rotated at a strictly specified definite angle thereto. This ultimately means that the data lines are no longer led exclusively on an optical fiber or, in the resin, but run over glass or resin in the same manner in alternation. Differences in signal transit time thus do not arise in the transmission process. Conventional, cost-effective printed boards can thus also be used for transmitting high-frequency signals, which is a significant cost advantage in the variety of printed circuit boards in use today.

This object is also achieved in accordance with the invention in a method for manufacturing said device by forming at least one optical fiber mat from a number of optical fiber bundles, and forming at least one pair of data lines for conducting electrical signals on a surface of the optical fiber mat at a specific angle to the optical fiber bundles.

These and other features of the invention(s) will become clearer with reference to the following detailed description of the presently preferred embodiments and accompanied drawings.

DESCRIPTION OF THE DRAWINGS

FIG. 1 is a perspective view of the structure of a glass mat constructed in accordance with the present invention.

FIG. 2 is a side view of the glass mat.

DETAILED DESCRIPTION OF THE PRESENTLY PREFERRED EMBODIMENTS

Figure 3:
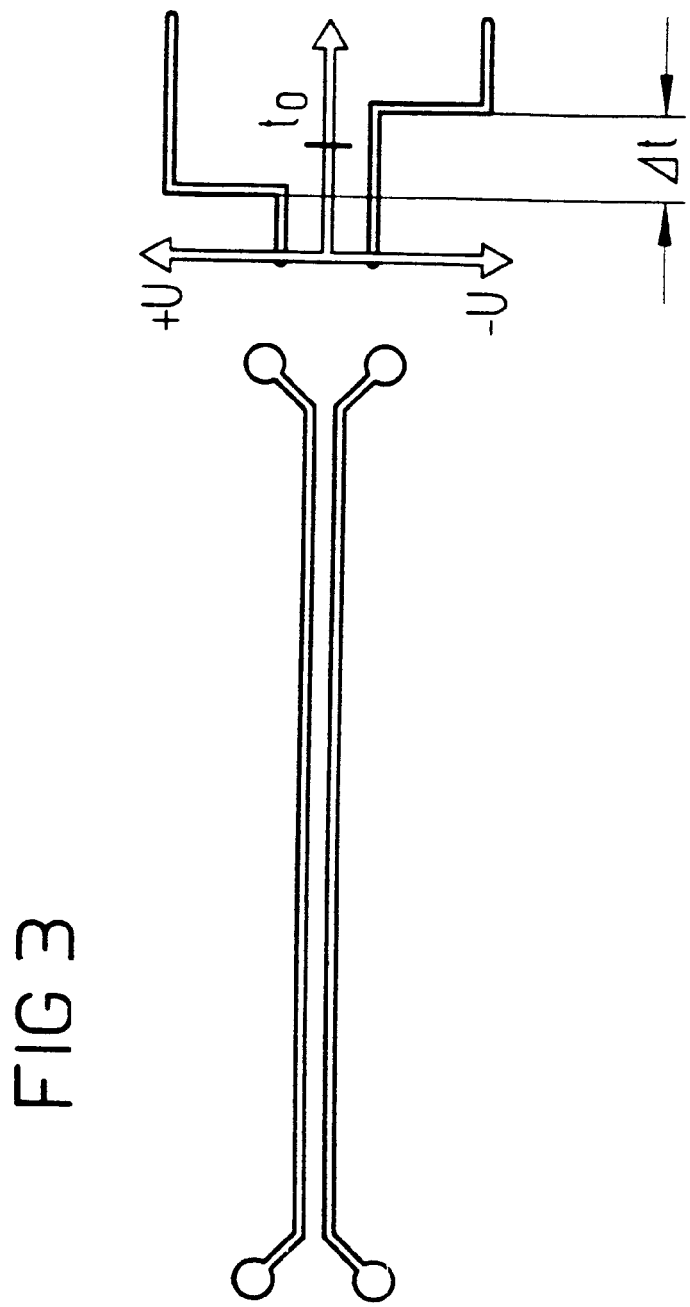
FIG. 3 shows the signal characteristic of a device according to the prior art.

FIG. 1 depicts the constructional structure of a glass mat. Accordingly, optical fiber bundles GF are depicted, which are arranged in parallel. The optical fiber bundles GF are connected and held together by a number of chains K, which also consist of glass-fiber bundles. According to FIG. 1, the chains K are woven about the optical fiber bundle GF with "phase positions" of 180°. In this respect, this type of structure is thoroughly similar to that of textiles. But the chains K and optical fiber bundles GF, which are arranged transversely to one another, are not only fixed mechanically; this device is also soaked in a resin that is used as an adhesive material, whereby the glass mat attains a quasi-homogenous structure. In this type of structure of glass mat, there is no privileged direction with respect to orthogonality. The two main axes are equally prioritized.

Data lines LP which conduct the complementary signals are arranged parallel to the optical fiber bundles GF according to the present embodiment. These respectively comprise two copper trace pairs $LP_a$, $LP_b$. The paired construction of the data lines is not absolutely required, however. Rather, a complementary transmission of electrical signals can also occur over only one data line.

FIG. 2 depicts a side view of the optical fiber mat which is illustrated in FIG. 1 and was just described. This depicts the optical fiber bundles GF, which are led in a parallel shape and which thus define the edges of the glass mat or of the circuit board. In addition, data lines $LP_1$, $LP_2$ are also depicted. It is essential that the two data lines are understood as alternatives, and that as such they are not both arranged in the glass mat in this form simultaneously. This is expressed in FIG. 2 by the dashed representation. The data line $LP_1$ consists of the copper trace pairs $LP_{1a}$ and $LP_{1b}$. The data line $LP_2$ is formed in the same way by a copper trace pair $LP_{2a}$ and $LP_{2b}$.

If all data lines of the optical fiber mat were to be led in the same manner as the data line $LP_1$, there would be no recognizable difference in the signal transit time at the end of a data line pair. This is attributable to the fact that the data cable $LP_1$ is integrated into the glass mat quasi-symmetrically, and is thus surrounded by the dielectrics of glass and resin the same way. Differences in the signal transit time compared to signals transmitted over another data line are unaffected and remain as before.

Problems arise in the leading of the data line $LP_2$ however. Here, one line of the copper cable pair $LP_{2b}$ is led in the vicinity of the optical fibers, which have a relatively high dielectricity constant ($\in_r=6$). The other copper cable of this cable pair $LP_{2a}$ runs primarily through resin, however, which has a far lower dielectricity constant ($\in=3$). Without suitable countermeasures being taken, the signal characteristic illustrated in FIG. 3 is fed at the receive side to a differential amplifier (not illustrated). The edges of the signals which are transmitted in a complementary manner differ by a time $\Delta t$.

In the present invention, care is now taken that the data lines are led through the optical fiber mat at a specific angle to the optical fiber bundle. This angle is preferably between 0.5° and 1°. Other embodiments of this angle are also possible. In any case, care must be taken in the selection of the angle that the data lines are not arranged parallel to the optical fibers.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. A device for transmitting high-frequency communication signals, the device comprising:
    at least one glass fiber mat formed from a number of glass fiber bundles; and
    at least one dataline for conducting undesired electrical signals formed on a surface of said glass fiber mat at an angle of between 0.5° an 1° relative to said glass fiber bundles.

2. The device according to claim 1, wherein said at least one glass fiber mat further comprises a number of said glass fiber bundles forming a printed circuit board.

3. The device according to claim 1, wherein said dataline further comprises a pair of datalines.

4. The device according to claim 3, wherein complementary transmission of said undesired electrical signals occurs over said pair of datalines.

5. A method for manufacturing a device for transmitting high-frequency communication signals, said method comprising the steps of:
    forming at least one glass fiber mat from a number of glass fiber bundles; and
    forming at least one pair of datalines for conducting electrical signals on a surface of said glass fiber mat at an angle of between 0.50° and 1° relative to said glass fiber bundles.

6. The method according to claim 5, further comprising the step of:
    forming a printed circuit board from a number of said glass fiber mats having at least one pair of datalines formed thereon.

* * * * *